United States Patent
Bako et al.

(10) Patent No.: US 11,031,916 B2
(45) Date of Patent: Jun. 8, 2021

(54) CIRCUIT WITH WIDE RANGE INPUT COMMON MODE VOLTAGE OPERATION

(71) Applicant: TEXAS INSTRUMENTS INCORPORATED, Dallas, TX (US)

(72) Inventors: Niko Bako, Freising (DE); Narayanan Seetharaman, Unterschliessheim (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/538,861

(22) Filed: Aug. 13, 2019

(65) Prior Publication Data

US 2019/0363685 A1    Nov. 28, 2019

Related U.S. Application Data

(63) Continuation of application No. 15/940,812, filed on Mar. 29, 2018, now Pat. No. 10,439,571.

(51) Int. Cl.
*H03F 3/45* (2006.01)

(52) U.S. Cl.
CPC .......... *H03F 3/45179* (2013.01); *H03F 3/45* (2013.01); *H03F 3/45757* (2013.01)

(58) Field of Classification Search
CPC ............ H03F 3/45179; H03F 3/45757; H03F 3/45475; H03F 3/45183; H03F 2203/45138; H03F 2203/45318
USPC ................................. 330/253, 254, 258, 261
See application file for complete search history.

(56) References Cited

U.S. PATENT DOCUMENTS

| 3,566,298 | A |   | 2/1971  | Stevens       |            |
|-----------|---|---|---------|---------------|------------|
| 4,587,500 | A |   | 5/1986  | Tanaka et al. |            |
| 5,557,238 | A |   | 9/1996  | Weiss         |            |
| 5,703,532 | A | * | 12/1997 | Shin          | H03F 3/265 |
|           |   |   |         |               | 330/253    |

(Continued)

FOREIGN PATENT DOCUMENTS

EP    1251640 A2    10/2002

OTHER PUBLICATIONS

Bazes, M. "Two Novel Fully Complementary Self-Biased CMOS Differential Amplifiers." IEEE Journal of Solid-State Circuits 20:2 (1991): 165-168.

(Continued)

*Primary Examiner* — Khanh V Nguyen
*Assistant Examiner* — Khiem D Nguyen
(74) *Attorney, Agent, or Firm* — Ray A. King; Charles A. Brill; Frank D. Cimino

(57) ABSTRACT

A circuit includes a first common mode amplifier including a first input, a second input, and a first output. The first common mode amplifier comprises a first plurality of self-biased differential amplifiers. The circuit also includes a second common mode amplifier including a third input, a fourth input, and a second output, The third input is connected to the second input and the fourth input is connected to the first input. The second common amplifier comprises a second plurality of self-biased differential amplifiers. The circuit further includes a first gain amplifier including a fifth input and a sixth input and a second gain amplifier including a seventh input and an eighth input. The first output is connected to the fifth and eight inputs and the second output is connected to the sixth and seventh inputs.

7 Claims, 2 Drawing Sheets

(56) References Cited

U.S. PATENT DOCUMENTS

| | | | | |
|---|---|---|---|---|
| 5,821,809 A | * | 10/1998 | Boerstler | ............ H03F 3/45183 |
| | | | | 327/563 |
| 6,469,579 B2 | * | 10/2002 | Bazes | ................. H03F 3/45192 |
| | | | | 330/253 |
| 7,466,198 B1 | | 12/2008 | Hunter | |
| 2007/0159215 A1 | | 7/2007 | Deng et al. | |

OTHER PUBLICATIONS

International Search Report in corresponding PCT Application No. PCT/US2019/024507, dated Jul. 4, 2019 (2 pages).

\* cited by examiner

CIRCUIT WITH WIDE RANGE INPUT COMMON MODE VOLTAGE OPERATION

CROSS REFERENCE TO RELATED APPLICATION(S)

This continuation application claims priority to U.S. patent application Ser. No. 15/940,812, filed Mar. 29, 2018, which application is incorporated herein by reference in its entirety.

BACKGROUND

With the increasing speed of clocking circuits such as clock buffers, phase-lock loops, and clock generators, the performance of input stages within integrated circuits has become a factor in the overall performance of the integrated circuit.

SUMMARY

In one example, a circuit includes a first transistor including a first control input and first and second current terminals and a second transistor including a second control input and third and fourth current terminals, wherein the fourth current terminal is connected to the second current terminal. A third transistor includes a third control input and fifth and sixth current terminals, wherein the sixth current terminal is connected to the first current terminal and the third control input is connected to the first control input at a first input node of the circuit. A fourth transistor includes a fourth control input and seventh and eighth current terminals, wherein the eighth current terminal is connected to the third current terminal at an output node of the circuit and the fourth control input is connected to the second control input at a second input node of the circuit. A first current source transistor is connected to the second and fourth current terminals. A second current source transistor is connected to the fifth and seventh current terminals. A fifth transistor includes a fifth control input and ninth and tenth current terminals, wherein the fifth control input is connected to the first input node of the circuit. A first resistor is connected to the tenth current terminal. A second resistor is connected to the eighth current terminal at the output node and to the first resistor.

In another example, a circuit includes a first common mode amplifier including a first input, a second input, and a first output. The first common mode amplifier comprises a first plurality of self-biased differential amplifiers. The circuit also includes a second common mode amplifier including a third input, a fourth input, and a second output, The third input is connected to the second input and the fourth input is connected to the first input. The second common amplifier comprises a second plurality of self-biased differential amplifiers. The circuit further includes a first gain amplifier including a fifth input and a sixth input and a second gain amplifier including a seventh input and an eighth input. The first output is connected to the fifth and eight inputs and the second output is connected to the sixth and seventh inputs.

In yet another example, a circuit includes a first transistor comprising a first control input and first and second current terminals and a second transistor including a second control input and third and fourth current terminals, wherein the third current terminal is connected to the first current terminal. A first current source transistor is included that comprises a third control input and fifth and sixth current terminals, wherein the sixth current terminal is connected to the first and third current terminals. A first resistor is connected to the second current terminal. A second resistor is connected to the first resistor and, at an output node, to the fourth current terminal. A second current source transistor includes a fourth control input and seventh and eighth current terminals. The seventh current terminal is connected to the first and second resistors. The third and fourth control inputs are connected together and to the second terminal.

BRIEF DESCRIPTION OF THE DRAWINGS

For a detailed description of various examples, reference will now be made to the accompanying drawings in which.

DETAILED DESCRIPTION

Various circuits are disclosed that are usable as input stages for integrated circuits. The circuits comprise amplifiers. The input signals to the illustrative amplifiers comprise differential time-varying inputs that include a common mode (CM) signal component. The input signals fluctuate over time with respect to the CM signal level. The CM signal level is between the voltages supplying power to the amplifiers (e.g., ground and VDD). One of the illustrative amplifiers operates when the input common mode (ICM) voltage level is at a lower level closer to the lower power supply voltage (e.g., ground). Another illustrative amplifier operates when the ICM voltage level is at a higher level closer to the higher power supply voltage (e.g., VDD). Yet another amplifier is designed for operation across a wide range of ICM voltage levels from close to the lower supply voltage (e.g., ground) to close to the higher power supply voltage (VDD). This latter amplifier is referred to herein as a wide input common mode amplifier (WICMA). The power supply voltages are referred to herein as ground and VDD.

Figure 1:
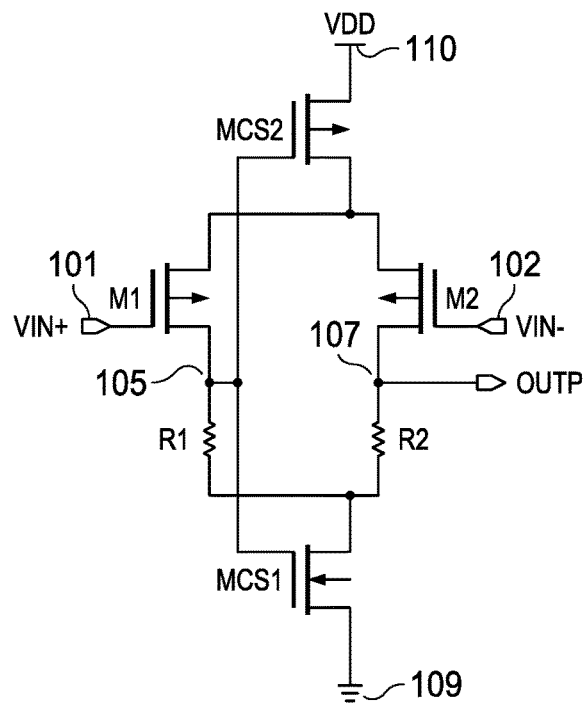
FIG. 1 illustrates an example of an amplifier circuit.

FIG. 1 illustrates an amplifier circuit that operates particularly well for ICM voltage levels that are closer to ground than the VDD. The illustrative amplifier circuit of FIG. 1 includes transistors M1, M2, MCS1, MCS2, and resistors R1 and R2. In this example, M1, M2, and MCS2 are p-type metal oxide semiconductor field effect (PMOS) transistors and MCS1 is an n-type metal oxide semiconductor field effect (NMOS) transistor. Each transistor has a control input (a gate in the example of NMOS or PMOS transistors) and a pair of current terminals (source and drain in the example of NMOS or PMOS transistors). The input signal to the amplifier of FIG. 1 is represented as VIN+ and VIN−, and the output from the amplifier is represented as OUTP, which is a single-ended signal (referenced to ground) in this example. VIN+ and VIN− are complementary voltages, that is, as VIN+ increases, VIN− decreases, and vice versa.

The gate of M1 is coupled to one input node 101 to thereby receive VIN+ and the gate of M2 is coupled to another input node 102 to thereby receive VIN−. The drain of M1 is connected to one terminal of R1. Similarly, the drain of M2 is connected to one terminal of R2. The other terminals of R1 and R2 are connected together and to the drain of MCS1. The source of MCS1 is connected to the ground node 109. The gates of MCS1 and MCS2 are connected together and to the node 105 between the drain of M1 and resistor R1. The drain of MCS2 is connected to the sources of both M1 and M2. The source of MCS2 is connected to a VDD node 110. The output OUTP from the amplifier is the voltage at node 107 between the drain of M2 and resistor R2.

The combination of M2 and R2 forms a common source amplifier whose current is supported (generated) by MCS2 and MCS1. At relatively low ICM voltages (close to ground), VIN+ and VIN− will swing complementarily between voltages that are close to ground (e.g., between 100 mV and 300 mV for an ICM voltage level of 200 mV, and thus a 100 mV swing). As VIN+ increases within that range, the voltage on node 105 decreases due to lower current flowing through R1 from MCS2 and M1. The voltage on node 105 enhances either PMOS current source MCS2 (when node 105 voltage decreases) or NMOS MCS1 (when node 105 voltage increases). Also the voltage on node 105 causes a change in the resistances of MCS1 and MCS2. As VIN+ increases, the voltage on node 105 decreases thereby enhancing MCS2 to deliver more current and the resistance of MCS2 reduces while the resistance of MCS1 increases. At the same time, the resistance of M2 decreases due to the decrease in VIN− to the gate of M2. Due to the decrease in the resistance of M2, the OUTP voltage increases. Conversely, as VIN+ decreases and VIN− increases, M1 is enhanced and thus voltage on node 105 increases, which in turn enhances MCS1 to deliver more current. Further, with a higher node 105 voltage the resistance of MCS1 decreases, the resistance of MCS2 increases, and the resistance of M2 increases (due to a decrease in VIN−). As a result, the OUTP voltage decreases.

Figure 2:
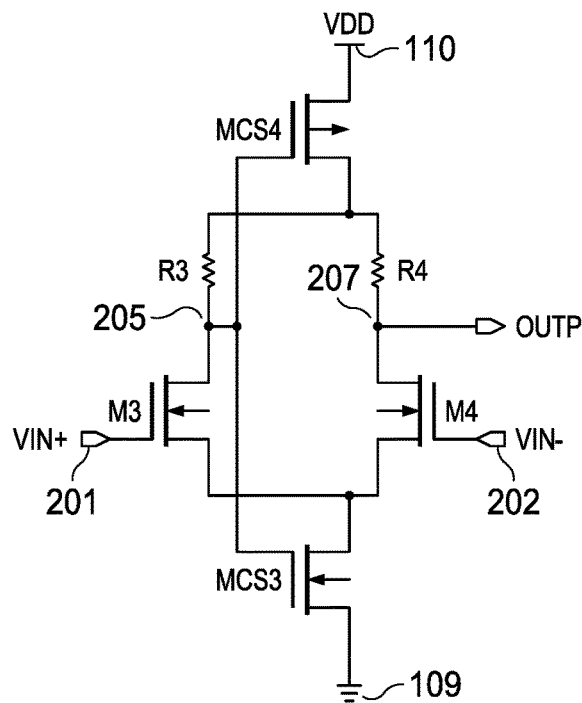
FIG. 2 illustrates another example of an amplifier circuit.

FIG. 2 illustrates an example of another common source amplifier circuit that operates particularly well for ICM voltage levels that are closer to VDD than to ground. The illustrative amplifier circuit of FIG. 2 includes transistors M3, M4, MCS3, MCS4, and resistors R3 and R4. In this example, M3, M4, and MCS3 are NMOS transistors and MCS4 is a PMOS transistor. As was the case for the example of FIG. 2, the input signal to the amplifier of FIG. 1 is represented as VIN+ and VIN−, and the output from the amplifier is represented as OUTP.

The gate of M3 is coupled to one input node 201 to thereby receive VIN+ and the gate of M4 is coupled to another input node 202 to thereby receive VIN−. The drain of M3 is connected to one terminal of R3. Similarly, the drain of M4 is connected to one terminal of R4. The other terminals of R3 and R4 are connected together and to the drain of MCS4. The source of MCS3 is connected to the ground node 109. The gates of MCS3 and MCS4 are connected together and to the node 205 between the drain of M3 and resistor R3. The drain of MCS3 is connected to the sources of both M3 and M4. The source of MCS4 is connected to VDD node 110. The output OUTP from the amplifier of the example of FIG. 2 is the voltage at node 207 between the drain of M4 and resistor R4.

The example of FIG. 2 operates similarly to the example of FIG. 1 but at ICM voltages that are closer to VDD rather than ground. The combination of M4 and R4 forms an amplifier whose current is supported (generated) by MCS4 and MCS3. At relatively high ICM voltages (close to VDD), VIN+ will swing between voltages that are close to VDD (e.g., between 800 mV and 1 V for an ICM voltage level of 900 mV and a 100 mV swing relative to the ICM voltage). As VIN+ increases within that range, the resistance of NMOS M3 decreases and thus the voltage on node 205 decreases. The decreasing voltage on node 205 enhances PMOS current source transistor MCS4 to deliver more current. At the same time the resistance of M4 increases due to the decrease in VIN−. An increase in resistance of M4 results in an increase in OUTP. Conversely, if MCS3 is enhanced to deliver more current more current (due to VIN+ decreasing causing node 205 voltage to increase), the resistance of MCS3 decreases while the resistance of MCS4 increases. As a result, OUTP decreases.

Figure 3:
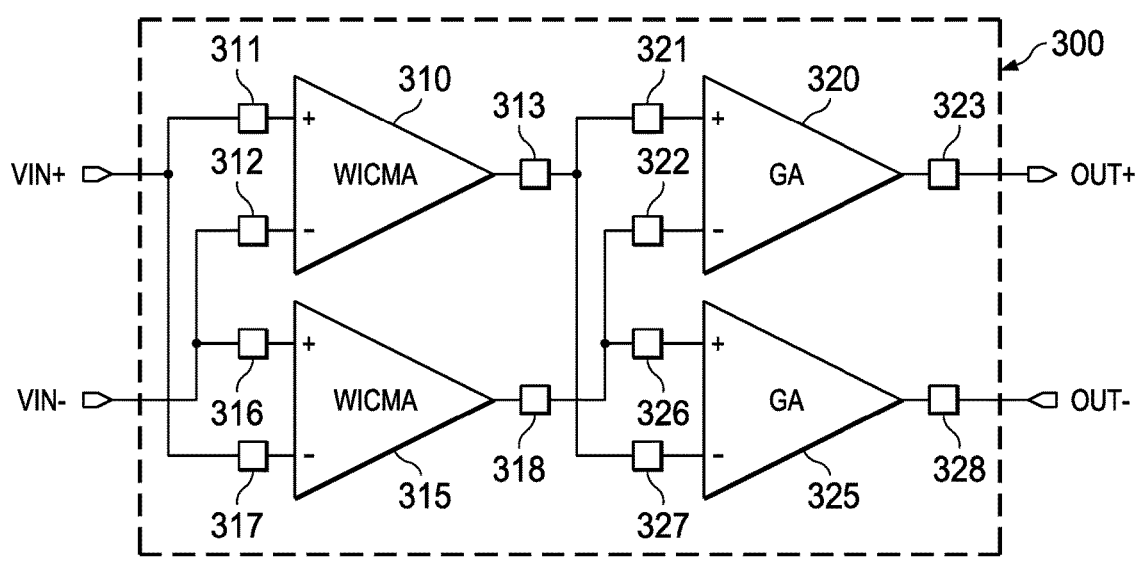
FIG. 3 illustrates a system that includes multiple wide input common mode amplifiers.
Figure 4:
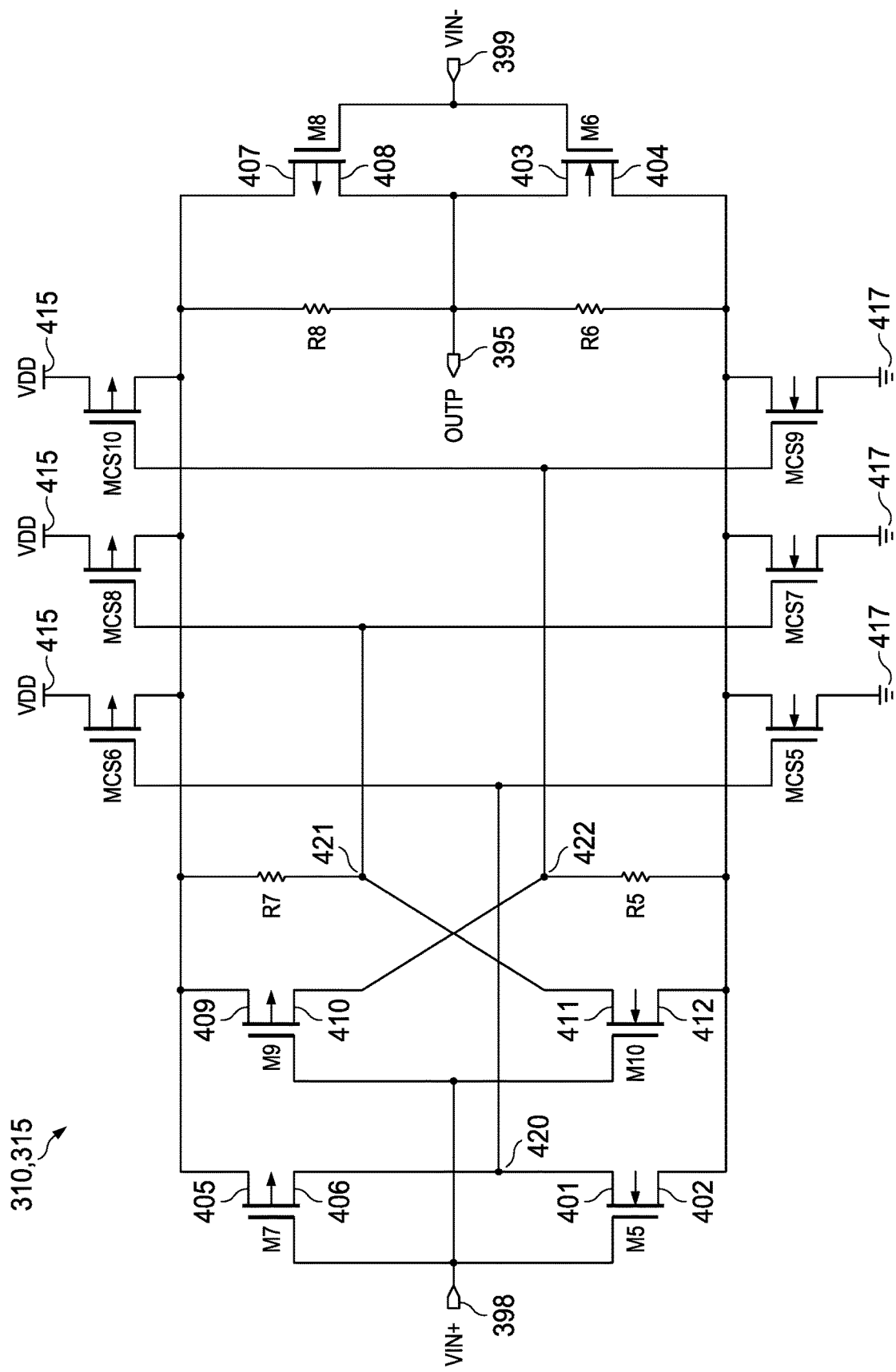
FIG. 4 shows an example of a wide input common mode amplifier.

FIG. 3 shows an embodiment of a circuit 300 that includes two WICMAs 310 and 315, and to gain amplifiers (GA) 320 and 325. FIG. 4 provides an illustrative implementation of each WICMA 310, 315 and will be discussed below. Each WICMA 310 comprises a plurality (e.g., three) of self-biased differential amplifiers which share common inputs and outputs. Each WICMA operates satisfactorily across a wide range of ICM voltage levels from just above ground to just below VDD. WICMA 310 produces a single-ended output on output node 313 and WICMA 315 produces a single-ended output on output node 318. Each WICMA has two input nodes—one designated as a positive input (+) and the other designated as a negative input (−). The input signal to the circuit 300 is represented by VIN+ and VIN−. The + input node 311 of WICMA 310 and the negative input node 317 of WICMA 315 are connected together and to the VIN− input. The negative input node 312 of WICMA 310 and the positive input node 316 of WICMA 315 are connected together and to the VIN+ input. As such, the VIN+ and VIN− inputs are connected with one polarity to WICMA 310 and with the opposite polarity to WICMA 315. As a result, the single-ended output on output node 313 from WICMA 310 has the same polarity as VIN+ and the single-ended output on output node 318 from WICMA 315 has the same polarity as VIN−. The output nodes 313 and 318 thus comprise a differential signal, similar to that VIN+ and VIN− but with a common mode voltage shift relative to the ICM voltage level of VIN+ and VIN−. The output nodes 313 and 318 comprise common mode voltages that are approximately half of the supply voltage VDD for any variation of ICM.

The gain factor of the WICMAs 310 and 315 may not be as much as is desired in many applications. Accordingly, a second stage comprising gain amplifiers 320 and 325 are included in the example of FIG. 3. Each GA 320, 325 includes a positive input and a negative input as was the case for the WICMAs 310, 315. The output node 313 from WICMA 310 is coupled to the positive input node 321 of GA 320 and to the negative input node 327 of GA 325. The output node 318 from WICMA 315 is coupled to the negative input node 322 of GA 320 and to the positive input node 326 of GA 325. The gain factors of GAs 320 and 325 may be application specific. In one example, the gain factor is 2, but can be other than 2 in other examples. The output from circuit 300 is taken as the voltage on the output nodes 323 and 328 of GA 320 and GA 325, respectively, as shown as OUT+ and OUT−.

Each of the WICMAs 310 and 315 may be implemented with a circuit such as that shown in the example of FIG. 4. The example WICMA implementation of FIG. 4 effectively combines three amplifiers together—one that operates with ICM voltage levels in the lower range closer to ground, one that operates with ICM voltage levels at the upper range closer to VDD, and one that operates with ICM voltages approximately half-way between ground and VDD. The three amplifiers share input voltage nodes 301 (VIN+) and 302 (VIN−) and an output voltage node 308 (OUTP).

The example WICMA of FIG. 4 includes transistors M5, M6, M7, M8, M9, and M10, current source transistors MCS5, MCS6, MCS7, MCS8, MCS9, and MCS10, and resistors R5, R6, R7, and R8. Transistors M7, M8, and M9 are PMOS transistors and transistors M5, M6, and M10 are NMOS transistors. Current source transistors MCS6, MCS8, and MCS10 are PMOS transistors and current source transistors MCS5, MCS7, and MCS9 are NMOS transistors. The transistors can be implemented with different dopings in other examples, and bipolar junction transistors can be used instead of MOS transistors.

The drain 406 of M7 is connected to the drain 401 of M5 at node 420. The gates of M7 and M5 are connected together at the VIN+ input voltage node 398. On the right side of the circuit, the drain 408 of M8 is connected to the drain 403 of M6 at the output voltage node (OUTP) 395. The gates of M8 and M6 are connected together at the VIN− input voltage node 399.

The gates of current source transistors MCS6 and MCS5 are connected together and also to node 420 to connect to the drains 401 and 406 of M5 and M7, respectively. The source of MCS6 is connected to the positive power node 415 (VDD) and the source of MCS5 is connected to ground node 417 (also termed a power node). The drain of MCS5 is connected to the sources 402 and 404 of M5 and M6, respectively. The drain of MCS6 is connected to the sources 405 and 407 of M7 and M8, respectively.

The combination of M5, M6, M7, M8, MCS5, and MCS6 represents one of the three amplifiers noted above subsumed within the architecture of the WICMA 310, 315. This particular amplifier operates when the ICM voltage level is in the mid-range between ground and VDD (e.g., approximately one-half of VDD). M6 and M8 function as an inverter between VIN− and OUTP. That is, as the VIN− voltage falls, OUTP rises, and vice versa. The inverter comprising M8 and M6 receives current via current source transistors MCS6 and MCS5. M5 and M7 also form an inverter to invert VIN+ on to node 420 (as VIN+ increases, the voltage on node 420 decreases, and vice versa).

The input to the amplifier is defined by VIN+ and VIN−, which has a particular ICM voltage (approximately mid-range between ground and VDD and which has a voltage swing relative to the ICM voltage level). In one example, the suitable ICM voltage level for the amplifier defined above is 600 mV for a VDD of 1V and may have a voltage swing of 200 mV relative to the ICM voltage level. Thus, VIN+ ranges from 500 mV to 700 mV, while at the same time VIN− ranges in the opposite direction from 700 mV to 500 mV. If VIN+ increases towards its upper voltage level (700 mV in this example), the voltage on node 420 decreases thereby biasing PMOS transistor MCS6 more strongly than NMOS transistor MCS5. While VIN+ increases, VIN− decreases. Due to the inverter formed by M8 and M6, the voltage on the output node 395 (OUTP) increases because M6 will be turned off as VIN− may be less than the switching threshold voltage of M6. With MCS6 being driven more strongly due the decrease in voltage on node 420 (which drives the gate of MCS6), current from MCS2 helps to increase the OUTP voltage even faster. By contrast, if VIN+ decreases and VIN− increases, the voltage on node 420 will increase thereby turning on M6 and MCS5 to a stronger state thereby providing a good conducting path from OUTP to ground thereby pulling OUTP down even faster than if the inverter formed by M7 and M5 was not present.

However, the amplifier formed by M5, M6, M7, M8, MCS5 and MCS6 may not function correctly at ICM voltage levels closer to ground or closer to VDD. At those higher or lower voltage levels, one of M6 or M8 may be stuck on or off thereby preventing the satisfactory operation. For example, if the ICM voltage level is 900 mV (with VDD equal to 1V and a 200 mV swing relative to the 900 mV ICM voltage level), M8 will permanently in the triode or even the sub-threshold region as VIN− swings between 800 mV and 1 V and thus also remains above the threshold voltage of M8. As such, M8 cannot operate as an amplifier. Similarly, if the input voltage is close to ground (e.g., ICM voltage of 200 mV with a 100 mV swing), then Vin− will be too low ever to turn on M6.

Another amplifier embedded in the architecture of each WICMA 310, 315 includes transistors M8 and M9, current source transistors MCS10 and MCS9, and resistors R5 and R6. The architecture of this amplifier is similar to that shown in the example of FIG. 1 and is operative for ICM voltage levels closer to ground. The drain 410 of M9 is connected to R5 (at node 422) which also connects to the gates of MCS10 and MCS9. The drain 408 of M8 is connected to R6, and R6 also connects to MCS9. The sources 409 and 407 of M9 and M8, respectively, connect to MCS10 as shown. As such, transistor M8 is a component both of the amplifier which is operative for ICM voltage levels in the mid-range between ground and VDD and of the amplifier which is operative for ICM voltage levels closer to ground. Resistors R5 and R6 are used for this latter amplifier to advantageously permit current to flow even at lower ICM voltage levels.

The operation of the amplifier formed by transistors M8 and M9, current source transistors MCS10 and MCS9, and resistors R5 and R6 functions similar to that described above regarding FIG. 1. When ICM is low (close to ground), the transistors M8, M9, MCS9 and MCS10 and the resistors R5 and R6 will operate as an amplifier because all NMOS transistors will be off (not conduct current). Also the PMOS transistors M7, MCS6 and MSC8 will not conduct current because the current path is interrupted with M5, MCS5 and MCS9 being off). R8 can be neglected because R8 is of a much lower resistance than M8. In the case in which VIN+ increases (albeit close to ground), the voltage on node 422 will decline because M9 will provide less current to the node 410. At the same time M8 becomes more open meaning it is capable of delivering more current to the OUTP node 395 due to the lower gate-to-source voltage on M8. As the voltage on node 422 decreases, MCS10 will be more open i.e. provide more current to the circuit. Since M8 provides a better conducting path for current than M9, the current from MCS10 will flow to OUTP rather than to node 422 thereby causing a voltage rise for OUTP. At the same time, when the node 422 node voltage decreases, the MCS9 will be less open (because MCS9 gate-to-source voltage is lower). Since less current is pulled from OUTP (through R6) the voltage at the node OUTP will rise quickly. The voltage OUTP is not clamped to VDD due to limited gain of the amplifier formed by M8, M9, MCS9 and MCS10 and the resistors R5 and R6. As long as VIN+ is greater than VIN−, the OUTP voltage will be high (high compared to the case when VIN+=VIN−). In the opposite case, when VIN+ declines and VIN− increases, M9 is enhanced to form a better conducting path for current than M8. The node 422 voltage declines, MCS10 provides less current to M8 and a majority of current flows through M9. At the same time MCS9 becomes more open (because its gate-to-source voltage is higher) which will pull down the OUTP voltage and the voltage OUTP is lower than in case when VIN+ equals VIN−. Also, in this case, the voltage OUTP is not clamped to ground.

A third amplifier embedded in the architecture of each WICMA 310, 315 includes transistors M6 and M10, current source transistors MCS8 and MCS7, and resistors R7 and R8. The architecture of this amplifier is similar to that shown in the example of FIG. 2 and is operative for ICM voltage levels closer to VDD. The drain 411 of M10 is connected to R7 (at node 421) and to the gates of MCS7 and MCS8. The drain 403 of M6 is connected to R8, and R8 also connects to MCS8. The sources 412 and 404 of M10 and M6, respectively, connect to MCS7 as shown. As such, transistor M6 is a component both of the amplifier which is operative for ICM voltage levels in the mid-range between ground and VDD and of the amplifier which is operative for ICM voltage levels closer to ground. Resistors R7 and R8 are used for this latter amplifier to advantageously permit current to flow even at lower ICM voltage levels.

The operation of the amplifier formed by transistors M6 and M10, current source transistors MCS8 and MCS7, and resistors R7 and R8 functions similar to that described above regarding FIG. 2. When ICM is high i.e. close to VDD the transistors M6, M10, MCS7 and MCS8 and the resistors R7 and R8 will operate as amplifier because all PMOS transistors will be off and thus not conduct current. Also the NMOS transistors M5, MCS5 and MSC9 will not conduct current because the current path is interrupted due to M7, MCS6 and MCS10 being off. In this case R6 can be neglected because the resistance of R6 is high compared to the resistance of M6. When the differential voltage VIN+ increases and thus VIN− decreases, M10 becomes a better conductive path for current than M6 because the M10 gate-to-source voltage raises while M6 gate-to-source decreases. At the same time the node 421 voltage decreases and MCS8 is more open and delivers more current. Since M10 is a better path for current, and thus less current will flow through R8. The voltage drop across R8 will be lower and the voltage OUTP increases. At the same time MCS7 is more closed and delivers less current which prevents the discharging of OUTP through R6 (i.e., the voltage at OUTP will raise faster due to small discharging current). In the opposite case when VIN+ decreases and VIN− increases, M6 is a better conducting path for current than M10. The node 421 voltage increases and MCS8 is less open i.e. delivers less current while MCS7 deliver more current. As a result, the node OUTP will discharge faster (much less current is injected into this node than is pulled from the node) and the voltage OUTP will decreases faster.

The pairs of current source transistors—MCS5/MCS6, MCS7/MCS8, and MCS9/MCS10—operate as described above based on the change in voltages of their corresponding nodes 420, 421, and 422.

The above discussion is meant to be illustrative various examples. Numerous variations and modifications are possible.

What is claimed is:

1. A circuit, comprising:
   a first common mode amplifier having a first input, a second input, and a first output;
   a second common mode amplifier having a third input, a fourth input, and a second output, wherein the third input is connected to the second input and the fourth input is connected to the first input;
   a first gain amplifier having a fifth input, a sixth input, and a third output; and
   a second gain amplifier having a seventh input, an eighth input, and a fourth output;
   wherein the first output is connected to the fifth and eighth inputs and the second output is connected to the sixth and seventh inputs; and
   wherein each of the first and second common mode amplifiers includes:
     a first transistor including a first control input and first and second current terminals, wherein the first control input is connected to a first input node of the circuit;
     a second transistor including a second control input and third and fourth current terminals, wherein the third current terminal is connected to the first current terminal and the second control input is connected to a second input node of the circuit;
     a first current source transistor connected to the first and third current terminals;
     a first resistor connected to the second current terminal;
     a second resistor connected to the fourth current terminal at an output node of the circuit;
     a second current source transistor connected to the second current terminal and the second resistor;
     a third transistor including a third control input and fifth and sixth current terminals, wherein the third control input is connected to the first input node of the circuit;
     a third resistor connected to the fifth current terminal;
     a fourth transistor including a fourth control input and seventh and eighth current terminals, wherein the fourth control input is connected to the second input node of the circuit and the seventh current terminal is connected to the output node; and
     a fourth resistor connected to the seventh current terminal at the output node and to the third resistor.

2. The circuit of claim 1, in which the first and fourth inputs comprise a first differential input of the circuit and the second and third inputs comprise a second differential input of the circuit.

3. The circuit of claim 1, wherein each of the first and second common mode amplifiers includes:
   a fourth current source transistor connected to the third and fourth resistors; and
   a fifth current source transistor connected to the sixth and eighth current terminals.

4. The circuit of claim 1, wherein each of the first and second common mode amplifiers includes:
   a fifth transistor having a fifth control input and ninth and tenth current terminals; and
   a sixth transistor having a sixth control input and eleventh and twelfth current terminals, wherein the twelfth current terminal is connected to the tenth current terminal.

5. The circuit of claim 4, wherein the fifth transistor is a p-type metal oxide semiconductor field effect transistor and the sixth transistor is an n-type metal oxide semiconductor field effect transistor.

6. The circuit of claim 1, wherein the first and second transistors are n-type metal oxide semiconductor field effect transistors.

7. The circuit of claim 1, wherein the third and fourth transistors are p-type metal oxide semiconductor field effect transistors.

* * * * *